(12) United States Patent
Yano et al.

(10) Patent No.: US 7,514,867 B2
(45) Date of Patent: Apr. 7, 2009

(54) LED LAMP PROVIDED WITH OPTICAL DIFFUSION LAYER HAVING INCREASED THICKNESS AND METHOD OF MANUFACTURING THEREOF

(75) Inventors: Tadashi Yano, Kyoto (JP); Kiyoshi Takahashi, Kyoto (JP); Masanori Shimizu, Kyoto (JP)

(73) Assignee: Panasonic Corporation, Osaka (JP)

( * ) Notice: Subject to any disclaimer, the term of this patent is extended or adjusted under 35 U.S.C. 154(b) by 296 days.

(21) Appl. No.: 10/582,329

(22) PCT Filed: Apr. 8, 2005

(86) PCT No.: PCT/JP2005/006959

§ 371 (c)(1),
(2), (4) Date: Jun. 9, 2006

(87) PCT Pub. No.: WO2005/104247

PCT Pub. Date: Nov. 3, 2005

(65) Prior Publication Data

US 2008/0074032 A1 Mar. 27, 2008

(30) Foreign Application Priority Data

Apr. 19, 2004 (JP) ............... 2004-122550

(51) Int. Cl.
*H05B 33/00* (2006.01)
(52) U.S. Cl. ............... 313/512; 313/501; 313/486; 313/110; 313/112; 445/24; 445/25; 257/98; 257/100
(58) Field of Classification Search ......... 313/498–512, 313/484–489, 110–112; 445/24–25; 257/98–100
See application file for complete search history.

(56) References Cited

U.S. PATENT DOCUMENTS

| 3,875,456 | A | * | 4/1975 | Kano et al. ............. 257/89 |
| 5,998,925 | A |   | 12/1999 | Shimizu et al. |
| 6,576,930 | B2 | * | 6/2003 | Reeh et al. ............. 257/98 |
| 6,653,765 | B1 |   | 11/2003 | Levinson et al. |
| 6,922,024 | B2 |   | 7/2005 | Yano et al. |
| 6,940,101 | B2 |   | 9/2005 | Yano et al. |

(Continued)

FOREIGN PATENT DOCUMENTS

JP         10-65221 A       3/1998

(Continued)

OTHER PUBLICATIONS

U.S. Appl. No. 11/277,952, filed Apr. 13, 2006, Shimizu.

(Continued)

*Primary Examiner*—Mariceli Santiago
(74) *Attorney, Agent, or Firm*—McDermott Will & Emery LLP

(57) ABSTRACT

An LED lamp according to the present invention includes: at least one LED chip 12 that is mounted on a substrate 11; a phosphor resin portion 13 that covers the LED chip 12; a lens 22 to act on the outgoing light of the phosphor resin portion 13; and an optical diffusion layer (light-transmissive resin portion 20), which is arranged between the phosphor resin portion 13 and the lens 22 and in which particles to scatter the light are dispersed.

13 Claims, 15 Drawing Sheets

U.S. PATENT DOCUMENTS

| | | |
|---|---|---|
| 6,949,772 B2 | 9/2005 | Shimizu et al. |
| 6,963,166 B2 | 11/2005 | Yano et al. |
| 7,005,679 B2 * | 2/2006 | Tarsa et al. .................. 257/89 |
| 2002/0011601 A1 | 1/2002 | Furukawa et al. |
| 2003/0189829 A1 | 10/2003 | Shimizu et al. |
| 2003/0214233 A1 | 11/2003 | Takahashi et al. |
| 2003/0218228 A1 | 11/2003 | Furukawa et al. |
| 2004/0190304 A1 | 9/2004 | Sugimoto et al. |
| 2005/0207165 A1 | 9/2005 | Shimizu et al. |
| 2005/0237747 A1 | 10/2005 | Shimizu et al. |
| 2005/0242362 A1 | 11/2005 | Shimizu et al. |
| 2005/0263777 A1 | 12/2005 | Yano et al. |
| 2005/0274973 A1 | 12/2005 | Takahashi et al. |
| 2006/0131594 A1 | 6/2006 | Yano et al. |

FOREIGN PATENT DOCUMENTS

| | | |
|---|---|---|
| JP | 10-173240 A | 6/1998 |
| JP | 10-242513 A | 9/1998 |
| JP | 2998696 | 11/1999 |
| JP | 2001-177157 A | 6/2001 |
| JP | 2002-50797 A | 2/2002 |
| JP | 2003-59332 A | 2/2003 |
| JP | 2003-110146 A | 4/2003 |
| JP | 2003-124528 A | 4/2003 |
| JP | 2003-249689 A | 9/2003 |
| JP | 2003-324215 A | 11/2003 |
| JP | 2004-172586 | 6/2004 |

OTHER PUBLICATIONS

U.S. Appl. No. 11/402,928, filed Apr. 13, 2006, Yano et al.

International Preliminary Report on Patentability issued in corresponding International Patent Application No. PCT/JP2005/006959, dated Mar. 1, 2007.

Chinese Office Action, with English Translation, issued in Corresponding Chinese Patent Application No. 200580002770.9, dated on Oct. 19, 2007.

* cited by examiner (a)

(b)

(a)

(b)

LED LAMP PROVIDED WITH OPTICAL DIFFUSION LAYER HAVING INCREASED THICKNESS AND METHOD OF MANUFACTURING THEREOF

RELATED APPLICATIONS

This application is the U.S. National Phase under 35 U.S.C. § 371 of International Application No. PCT/JP2005/006959, filed on Apr. 8, 2005, which in turn claims the benefit of Japanese Application No. 2004-122550, filed on Apr. 19, 2004, the disclosures of which Applications are incorporated by reference herein.

TECHNICAL FIELD

The present invention relates to a method for fabricating an LED lamp and to an LED lamp and more particularly relates to a method for fabricating a white LED lamp that can be used as general illumination and to a white LED lamp.

BACKGROUND ART

A light emitting diode (which will be referred to herein as an "LED chip") is a semiconductor device that can radiate an emission in a bright color with high efficiency even though its size is small. The emission of an LED chip has an excellent monochromatic peak. To produce white light from LED chips, a conventional LED lamp arranges red, green and blue LED chips close to each other and gets the light rays in those three different colors diffused and mixed together. An LED lamp of this type, however, easily produces color unevenness because the LED chip of each color has an excellent monochromatic peak. That is to say, unless the light rays emitted from the respective LED chips are mixed together uniformly, color unevenness will be produced inevitably in the resultant white light. Thus, to overcome such a color unevenness problem, an LED lamp for producing white light by combining a blue LED chip and a yellow phosphor was developed (see Patent Documents Nos. 1 and 2, for example).

According to the technique disclosed in Patent Document No. 1, white light is produced by combining together the emission of a blue LED chip and the yellow emission of a yellow phosphor, which is produced when excited by the emission of the blue LED chip. That is to say, the white light can be produced by using just one type of LED chips. That is why the color unevenness problem, which arises when white light is produced by arranging multiple types of LED chips close together, is avoidable.

However, the luminous flux of a single LED chip is too low. Accordingly, to realize a luminous flux comparable to that of an incandescent lamp, a fluorescent lamp or any other general illumination used extensively today, an LED lamp preferably includes a plurality of LED chips that are arranged as an array. LED lamps of that type are disclosed in Patent Documents Nos. 3 and 4, for example.

Patent Document No. 5 discloses an LED lamp that can overcome the color unevenness problem of the bullet-shaped LED lamp disclosed in Patent Document No. 2. First, this color unevenness problem and a configuration for an LED lamp that is designed to overcome such a problem will be described.

The LED lamp with the bullet-shaped appearance as disclosed in Patent Document No. 2 has a configuration such as that illustrated in FIG. 1. As shown in FIG. 1, the bullet-shaped LED lamp 200 includes an LED chip 121, a bullet-shaped transparent enclosure 127 to cover the LED chip 121, and leads 122a and 122b to supply current to the LED chip 121. A cup reflector 121 for reflecting the emission of the LED chip 121 in the direction pointed by the arrow D is provided for the mount portion of the lead 122b on which the LED chip 121 is mounted. The LED chip 121 is encapsulated with a first resin portion 124, in which a phosphor 126 is dispersed and which is further encapsulated with a second resin portion 125. If the LED chip 121 emits a blue light ray, the phosphor 126 is excited by the blue light ray to produce a yellow light ray. As a result, the blue and yellow light rays are mixed together to produce white light.

However, the first resin portion 124 is formed by filling the cup reflector 123 with a resin to encapsulate the LED chip 121 and then curing the resin. Therefore, the first resin portion 124 easily has a rugged upper surface as shown in FIG. 2 on a larger scale. Accordingly, the thickness of the resin including the phosphor 126 loses its uniformity, thus making non-uniform the amounts of the phosphor 126 present along the optical paths E and F of multiple light rays going out of the LED chip 121 and passing through the first resin portion 124. As a result, unwanted color unevenness is produced.

To overcome such a problem, the LED lamp disclosed in Patent Document No. 5 is designed such that the reflective surface of a light reflecting member (i.e., a reflector) is spaced apart from the side surface of a resin portion in which a phosphor is dispersed.

Hereinafter, an exemplary LED lamp as disclosed in Patent Document No. 5 will be described with reference to FIGS. 3(a) and 3(b).

In the LED lamp 300 shown in FIGS. 3(a) and 3(b), an LED chip 112 mounted on a substrate 111 is covered with a resin portion 113 in which a phosphor is dispersed. A reflector 151 with a reflective surface 151a is bonded to the substrate 111 such that the reflective surface 151a of the reflector 151 is spaced apart from the side surface of the resin portion 113. Thus, the shape of the resin portion 113 can be freely designed without being restricted by the shape of the reflective surface 151a of the reflector 151. As a result, the color unevenness can be reduced significantly.

FIG. 4 shows a configuration for an LED lamp 300 in which the LED lamps having the structure shown in FIG. 3 are arranged in matrix on a substrate. In the LED lamp 300, the resin portions 113, each covering its associated LED chip 112, are arranged in columns and rows on the substrate 111, and a reflector 151, having a plurality of reflective surfaces 151a for the respective resin portions 113, is bonded onto the substrate 111.

By adopting such an arrangement, the luminous fluxes of a plurality of LED chips can be combined together. Thus, a luminous flux, comparable to that of an incandescent lamp, a fluorescent lamp or any other general illumination source that is used extensively today, can be produced easily.

Patent Document No. 5 further discloses an arrangement for reducing the color unevenness even if the phosphor is distributed non-uniformly in the resin portion 13 (i.e., if the phosphor over the upper surface of the LED chip 12 is distributed differently from that around the side surfaces of the LED chip 12). Such an arrangement will be described with reference to FIG. 5.

The resin portion 13 including the phosphor is preferably made of an epoxy resin or a silicone resin. While setting thermally, each of these resins has an extremely decreased viscosity albeit temporarily. Accordingly, if the phosphor has a mean particle size of 3 μm to 15 μm and has a greater specific gravity than the resin, then the phosphor will cause a sedimentation phenomenon while the resin is setting thermally.

FIG. 5 schematically illustrates an exaggerated example in which a sediment phosphor layer 101 is formed on the bottom of the resin layer 113.

While setting thermally, the silicone resin does not have its viscosity decreased as extremely as the epoxy resin, is softer than the epoxy resin, and can relax the stress better than the epoxy resin. Patent Document No. 5 sets the conditions for matching the color of the light 103 radiated from the upper surface of the resin portion 113 with that of the light 104 radiated from the side surface of the resin portion 113 where the resin portion 113 is made of a silicone resin and discloses an arrangement for reducing the color unevenness.

Patent Document No. 1: Japanese Patent Application Laid-Open Publication No. 10-242513

Patent Document No. 2: Japanese Patent No. 2998696

Patent Document No. 3: Japanese Patent Application Laid-Open Publication No. 2003-59332

Patent Document No. 4: Japanese Patent Application Laid-Open Publication No. 2003-124528

Patent Document No. 5: Japanese Patent Application Laid-Open Publication No. 2004-172586

As described above, various techniques for eliminating the color evenness from LED lamps have been proposed so far. However, the present inventors discovered that the color unevenness still persists in the prior art in the following situation.

According to the conventional techniques described above, the color unevenness should have disappeared and an LED lamp that causes no color unevenness should have been realized. Actually, however, it was discovered that light rays radiated obliquely from the corners 113a of a resin portion 113 as shown in FIG. 6 produced yellowish white light. As a result, when viewed from over the substrate 111, the LED lamp radiated light in multiple colors in which central white light 103 was surrounded with yellowish white light 105, which was further surrounded with white light 104, as shown in FIG. 7.

The obliquely radiated light 105 turns yellowish mainly because the light 105 has to travel a longer distance through the phosphor than vertical light 103 or horizontal light 104. That is to say, only the light passing through the corners 113a has to be transmitted through a lot of phosphor and therefore turns yellowish. In this case, it seems to be easy to minimize the color unevenness just by rounding those corners 113a. However, the resin portion 113 is usually formed by a printing technique as shown in FIG. 8. According to such a technique, a cylindrical resin portion 113 can be formed with high precision. However, even if one tries to form such a resin portion 113 with rounded corners by the printing technique, it is difficult to cut holes in such a shape through a printing stencil. Thus, the holes cannot have the exactly intended shape. As a result, the precision decreases compared to forming the cylindrical resin portion 113.

FIG. 8 shows the process step of forming resin portions 113 by a stencil printing technique. According to this printing technique, a printing stencil 51, having a plurality of openings (or through holes) 51a in the same size and shape as the resin portions 113 to be formed, is arranged over a substrate 111, on which a plurality of LED chips 112 are arranged, such that the LED chips 12 are located within the openings 51a. Then, the printing stencil 51 and the substrate 111 are brought into close contact with each other. Thereafter, a squeeze 52 is moved in a printing direction, thereby filling the openings 51a with a resin paste 55 on the printing stencil 51 and covering the LED chips 112 with the resin paste 55. When the printing process is finished, the printing stencil 51 is removed. The phosphor is dispersed in the resin paste 60. Accordingly, when the resin paste 55 is cured, the phosphor resin portions 113 can be obtained.

Resin portions 113 were actually formed by the printing technique shown in FIG. 8 on an eight by eight array of LED chips 112. The degrees of precision and error were as follows. If the LED chips 112 had chip dimensions of 0.3 mm×0.3 mm and the resin portions 113 should have a cylindrical shape with a diameter φ of 0.8 mm, then the resin portions 113 could be formed using a stencil that had holes with a precision (or error) of about 5 μm. However, if substantially conical resin portions 113 with a trapezoidal vertical cross section should be formed to round the corners 113a, then the precision (or error) of the stencil holes reached about 10 μm. With such bad precision, even if the color unevenness that would have been caused by the corners 113a could be minimized, color unevenness would still be produced here and there due to the variation in shape between the stencil holes. As a result, the color unevenness could not be eliminated from the LED lamp as a whole.

Portion (b) of FIG. 9 is a graph showing a relationship between the color temperature [K] and the spatial distribution of light [degrees] in an LED lamp. In portion (a) of FIG. 9, this relationship is associated with the schematic view shown in FIG. 7. In portion (b) of FIG. 9, the bold curve A shows the spatial distribution of light in a situation where the color unevenness was produced. In the area 105 that looked yellowish, the color temperature decreased to about 3,000 K, for example. Naturally, such a local low color temperature area 105 should be eliminated. Thus, the color unevenness should be eliminated by minimizing the difference in color temperature as plotted by the dotted curve B.

In order to overcome the problems described above, a primary object of the present invention is to provide a method for fabricating more easily an LED lamp that causes significantly reduced color unevenness. Another object of the present invention is to provide an LED lamp that causes significantly reduced color unevenness.

DISCLOSURE OF INVENTION

A method for fabricating an LED lamp according to the present invention includes the steps of: (a) preparing a substrate including at least one LED chip thereon; (b) forming a phosphor resin portion on the substrate such that the LED chip is covered with the phosphor resin portion; and (c) arranging a lens that acts on the outgoing light of the phosphor resin portion. The method further includes the step of (d) forming an optical diffusion layer, in which particles to scatter the outgoing light of the phosphor resin portion are dispersed, between the phosphor resin portion and the lens.

In one preferred embodiment, the optical diffusion layer is made of a light-transmissive resin in which the particles are dispersed.

In this particular preferred embodiment, the phosphor resin portion has a cylindrical shape.

In a specific preferred embodiment, the step (c) includes forming the optical diffusion layer that has a substantially uniform thickness over a surface of the phosphor resin portion.

In another preferred embodiment, the optical diffusion layer has a thickness of 10 μm to 1 mm.

In still another preferred embodiment, the method further includes the step of increasing the thickness of the optical diffusion layer on the upper surface of the phosphor resin portion from around the center of the upper surface toward the periphery of the upper surface.

In yet another preferred embodiment, the particles are made of at least one material selected from the group consisting of $SiO_2$, MgO, $BaSO_4$ and $Al_2O_3$.

In yet another preferred embodiment, the LED chip is a bare chip LED, which has been flip-chip bonded onto the substrate.

In yet another preferred embodiment, the steps (b) and (d) are performed by a printing technique.

An LED lamp according to the present invention includes: at least one LED chip that is mounted on a substrate; a phosphor resin portion that covers the LED chip; a lens to act on the outgoing light of the phosphor resin portion; and an optical diffusion layer, which is arranged between the phosphor resin portion and the lens and in which particles to scatter the light are dispersed.

In one preferred embodiment, the phosphor resin portion includes a phosphor for converting the emission of the LED chip into light that has a longer wavelength than the emission, and the optical diffusion layer is made of a light-transmissive resin in which the particles are dispersed.

In another preferred embodiment, the optical diffusion layer covers at least the periphery of the upper surface of the phosphor resin portion.

In still another preferred embodiment, the phosphor resin portion has a cylindrical shape.

In yet another preferred embodiment, the optical diffusion layer covers a surface of the phosphor resin portion and has a substantially uniform thickness.

In yet another preferred embodiment, the LED lamp further includes a reflector, which has an opening to store the light-transmissive resin portion therein, on the substrate, and a side surface defining the opening functions as a reflective surface for reflecting the emission of the LED chip.

In yet another preferred embodiment, the reflective surface is spaced apart from a side surface of the light-transmissive resin portion.

EFFECTS OF THE INVENTION

In a method for fabricating an LED lamp according to the present invention, the step of forming an optical diffusion layer, in which particles to scatter the outgoing light of a phosphor resin portion (i.e., a diffusing agent) are dispersed, is performed between the step of forming the phosphor resin portion on a substrate such that an LED chip is covered with the phosphor resin portion and the step of arranging a lens that acts on the outgoing light of the phosphor resin portion. In this manner, an LED lamp that causes significantly reduced color unevenness can be fabricated more easily. That is to say, by forming a light-transmissive resin portion including a diffusing agent (i.e., the optical diffusion layer) to cover the phosphor resin portion, the light to be obliquely radiated from the phosphor resin portion as viewed from the LED chip (e.g., yellowish white light) can be scattered by the light-transmissive resin portion and mixed with light rays in the other colors, thus substantially eliminating the color unevenness. In addition, since the optical diffusion layer is formed after the phosphor resin portion has been formed, the method of making the phosphor resin portion itself does not have to be changed. That is why the LED lamp can be fabricated while keeping the size and shape precisions of the phosphor resin portion sufficiently high.

If a printing technique is adopted to carry out the process step of forming the phosphor resin portion and the process step of forming the optical diffusion layer, a lot of members can be formed at a time, which is beneficial for the manufacturer. Besides, if the printing technique is adopted in both of these process steps, the two process steps can be carried out continuously just by changing the stencils. As a result, the throughput increases and the optical diffusion layer that has a similar profile to that of the phosphor resin portion can be formed more easily.

In the LED lamp of the present invention, the optical diffusion layer is arranged so as to cover the phosphor resin portion and particles (i.e., a diffusing agent) are dispersed in the optical diffusion layer. Thus, the light rays radiated obliquely upward as viewed from the LED chip can be diffused and mixed with light rays in the other colors. Consequently, the color unevenness can be reduced significantly.

Figure 9:
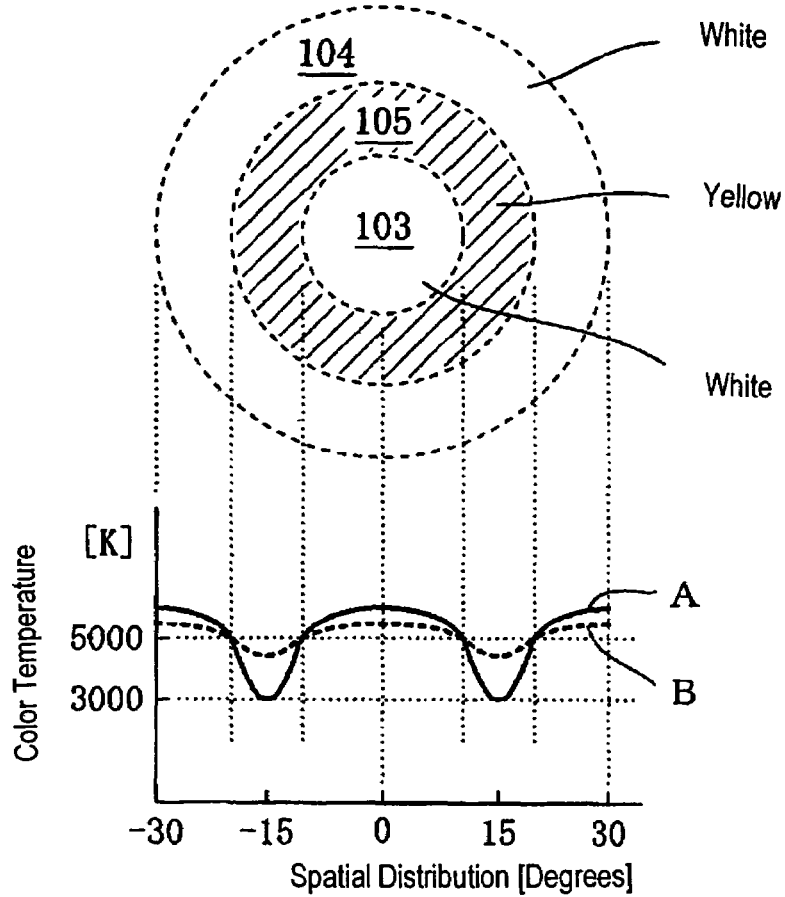
Figure 9:
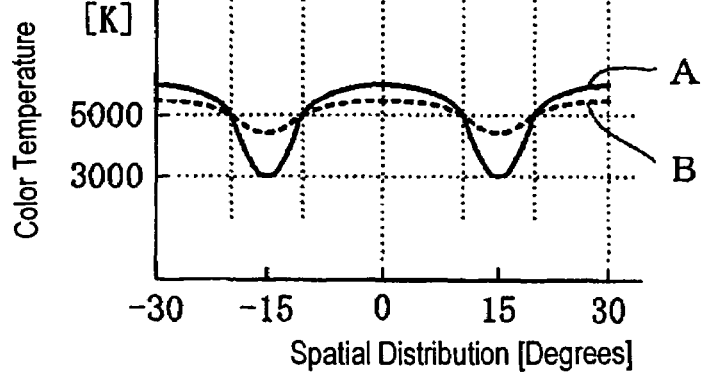

Portion (a) of FIG. 9 is a top view illustrating a state where color unevenness has been produced, and portion (b) of FIG. 9 is a graph showing a relationship between the spatial distribution of light [degrees] and the color temperature [K] in association with portion (a).

Figure 10:
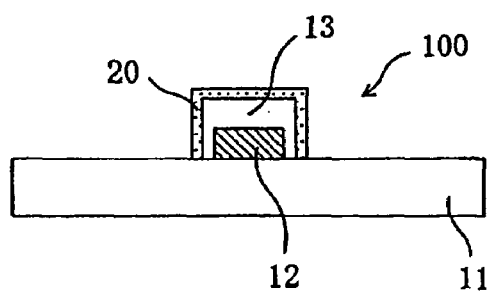

FIG. 10 is a cross-sectional view schematically illustrating a configuration for an LED lamp 100 according to a preferred embodiment of the present invention.

Figure 11:
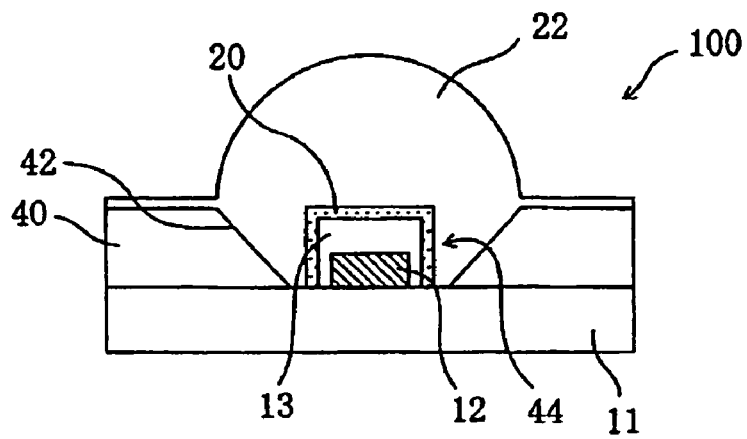

FIG. 11 is a cross-sectional view schematically illustrating a configuration for an LED lamp 100 according to another preferred embodiment of the present invention.

Figure 12:
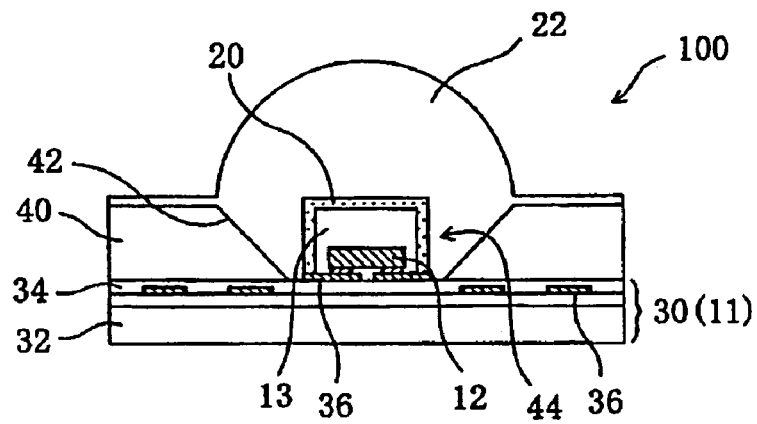

FIG. 12 is a cross-sectional view schematically illustrating a configuration for an LED lamp 100 according to still another preferred embodiment of the present invention.

Figure 13:
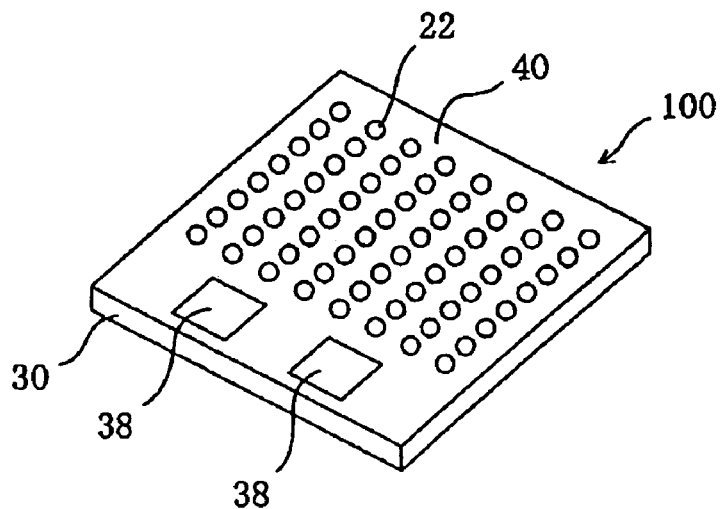

FIG. 13 is a perspective view schematically illustrating a configuration for a card LED lamp 100 according to yet another preferred embodiment of the present invention.

FIGS. 14(a) through 14(d) are cross-sectional views illustrating respective process steps for fabricating an LED lamp 100 according to a preferred embodiment of the present invention.

FIGS. 15(a) through 15(c) are cross-sectional views illustrating respective process steps for fabricating the LED lamp 100 of the preferred embodiment of the present invention.

Figure 16:
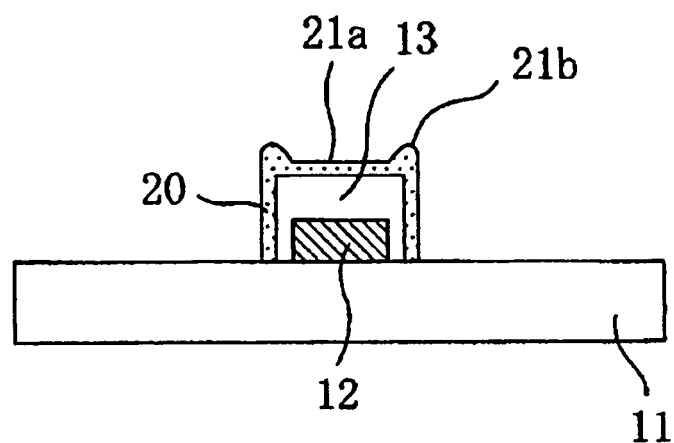

FIG. 16 is a cross-sectional view schematically illustrating a modified example of an LED lamp 100 according to a preferred embodiment of the present invention.

Figure 17:
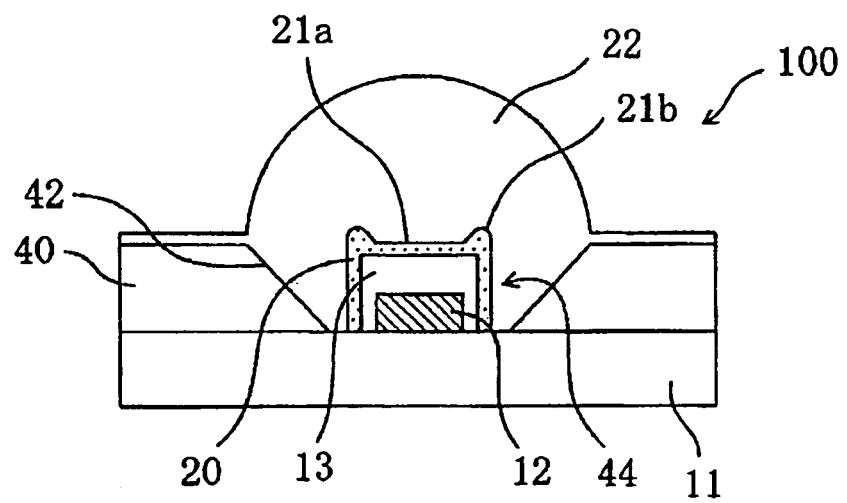

FIG. 17 is a cross-sectional view schematically illustrating another modified example of an LED lamp 100 according to a preferred embodiment of the present invention.

Figure 18:
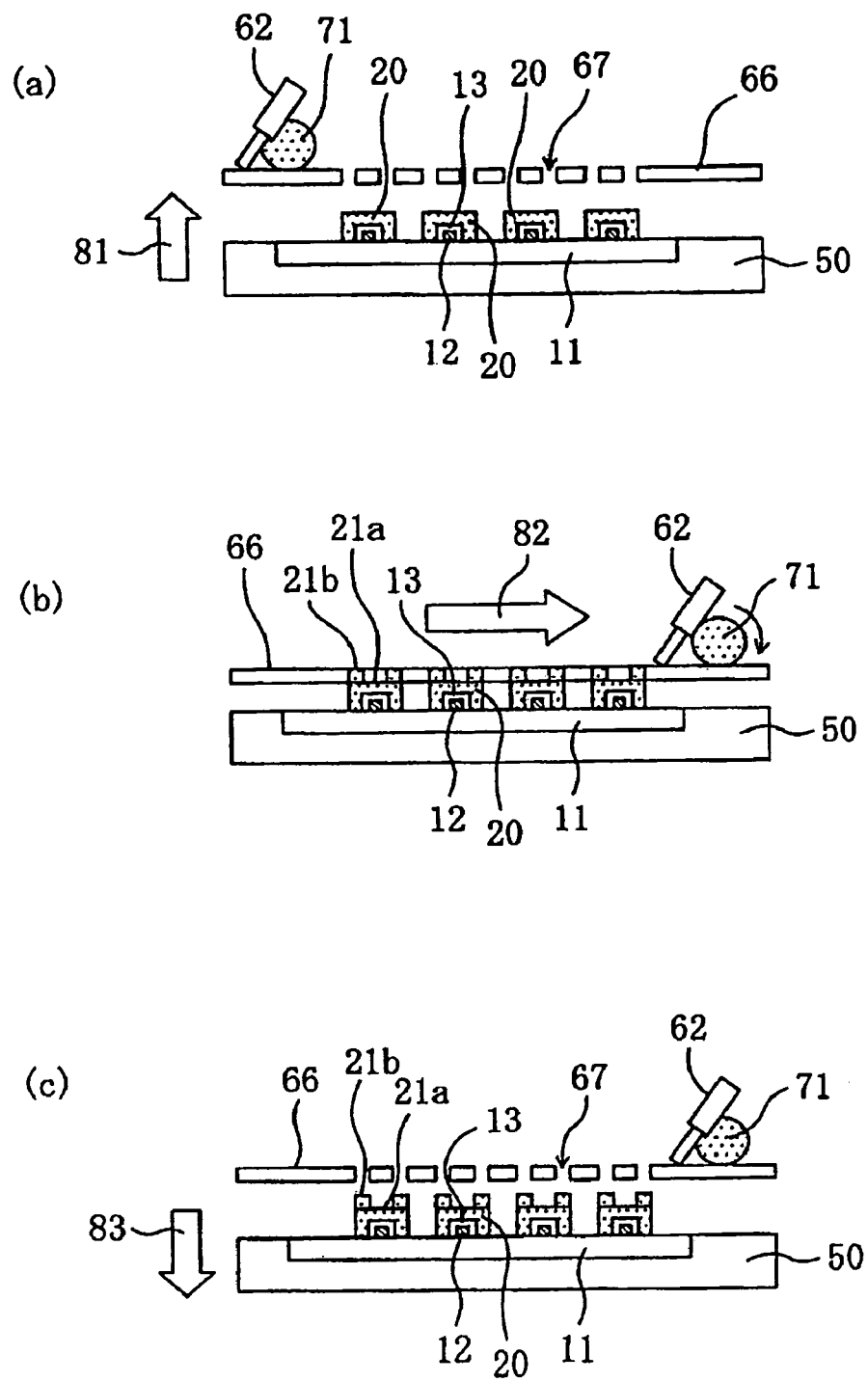

FIGS. 18(a) through 18(c) are cross-sectional views illustrating respective process steps for fabricating an LED lamp 100 according to a preferred embodiment of the present invention.

Figure 19:
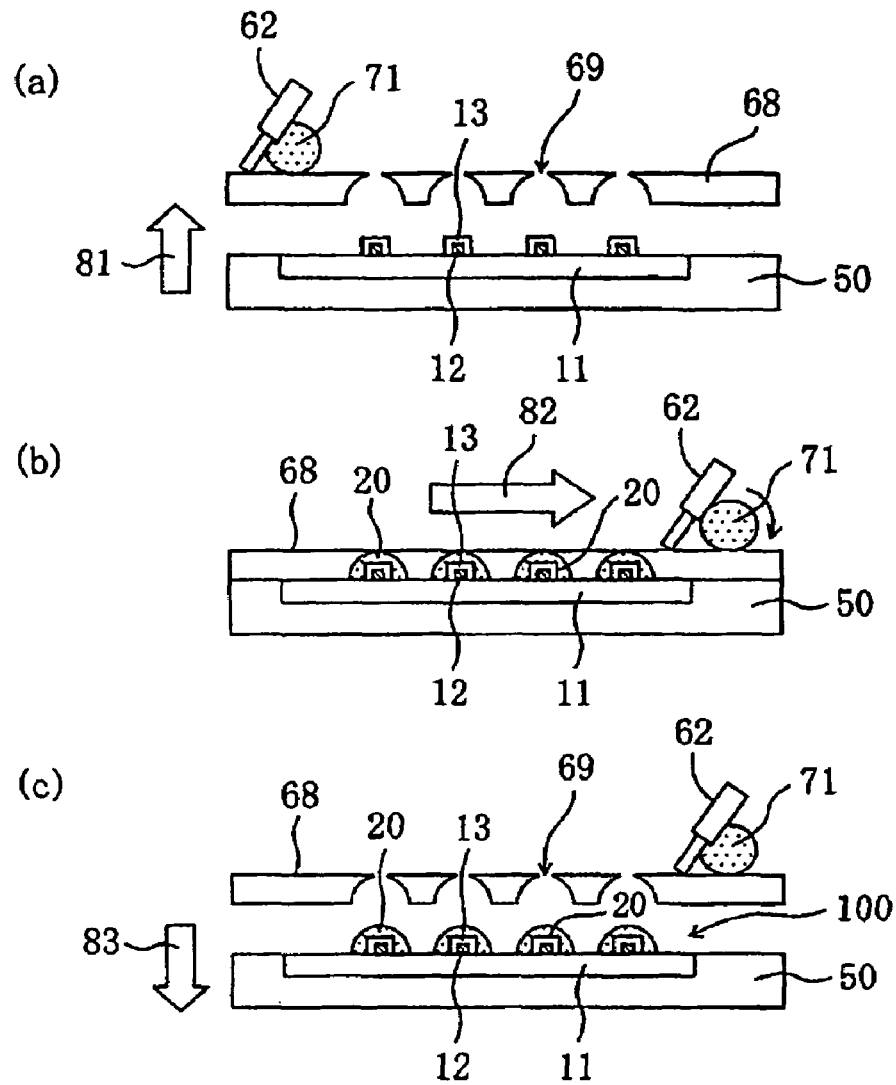

FIGS. 19(a) through 19(c) are cross-sectional views illustrating respective process steps for fabricating an LED lamp 100 according to a preferred embodiment of the present invention.

Figure 20:
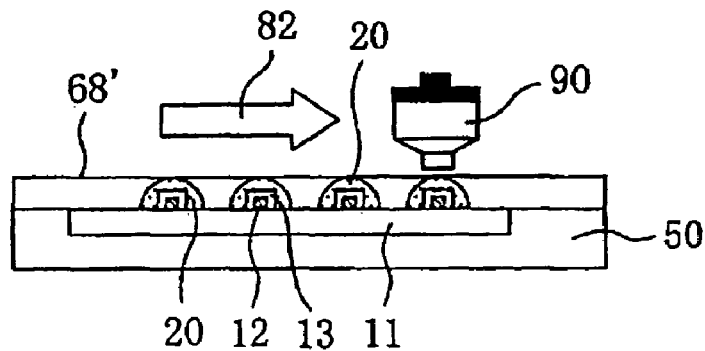

FIG. 20 is a cross-sectional view illustrating a process step for fabricating an LED lamp 100 according to a preferred embodiment of the present invention.

FIGS. 21(a) through 21(d) are cross-sectional views illustrating respective process steps for fabricating an LED lamp 100 according to a preferred embodiment of the present invention.

Figure 22:
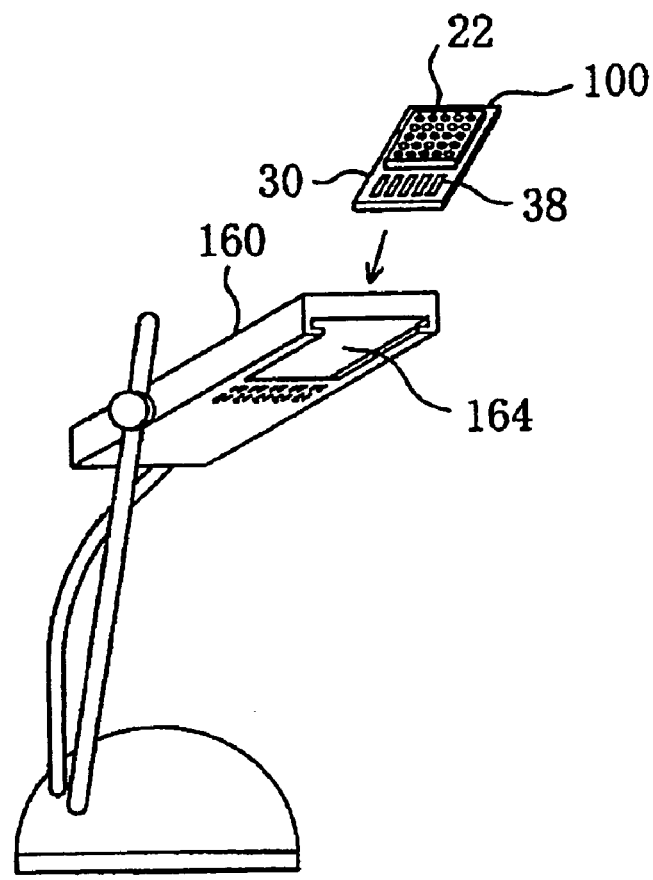

FIG. 22 is a perspective view schematically illustrating an application of the LED lamp 100.

Figure 23:
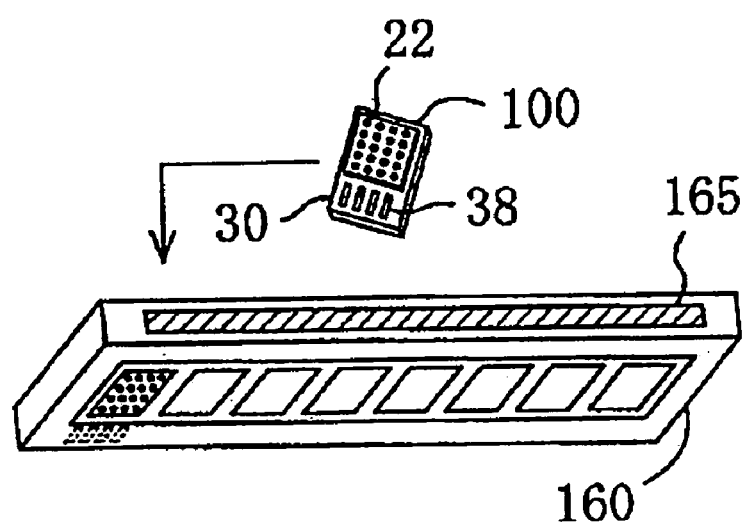

FIG. 23 is a perspective view schematically illustrating another application of the LED lamp 100.

Figure 24:
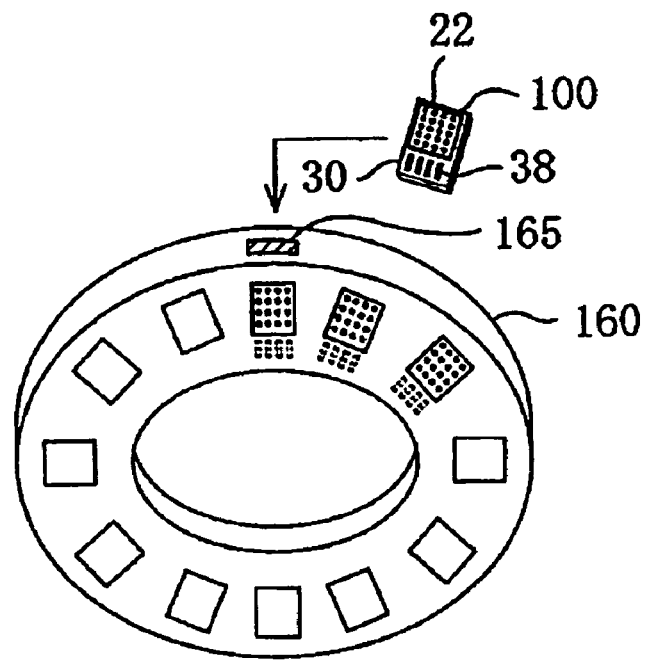

FIG. 24 is a perspective view schematically illustrating still another application of the LED lamp 100.

FIGS. 25(a) and 25(b) are respectively a side cross-sectional view and a top view illustrating a configuration in which two LED chips 12A and 12B are arranged in a single phosphor resin portion 13.

FIGS. 26(a) through 26(c) are cross-sectional views schematically illustrating other modified examples of an LED lamp 100 according to a preferred embodiment of the present invention.

Figure 27:
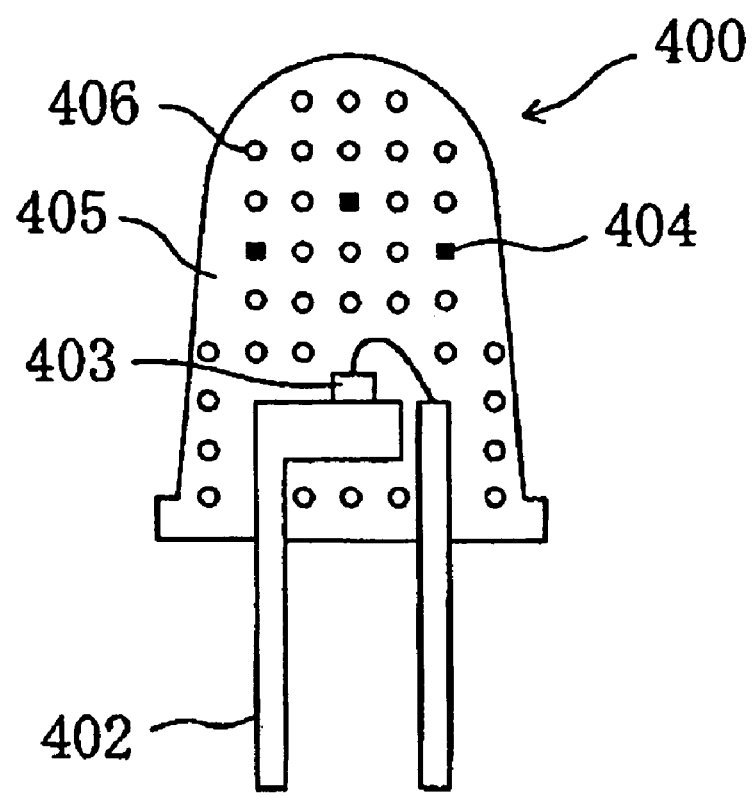

FIG. 27 is a cross-sectional view illustrating a configuration for a conventional LED lamp including a phosphor.

DESCRIPTION OF REFERENCE NUMERALS 11 substrate
12 LED chip
13 phosphor resin portion
20 light-transmissive resin portion (optical diffusion layer)
21a upper surface central area
21b upper surface peripheral area
22 lens
30 multilayer substrate
32 base substrate
34 interconnect layer
36 interconnect pattern
38 feeder terminal
40 reflector
42 reflective surface
44 opening
50 stage
51 printing stencil
51a opening
52 squeeze
55 resin paste
60, 61 metallic mask
62 squeeze
64, 65, 67, 69 opening
66, 68, 68' mask
70 phosphor paste
71 resin paste
90 dispenser
92 upper half
93 protrusion
94 lower half
96 substrate
100 lamp
160 body portion
164 receptacle
165 slot
200, 300 lamp

MODE FOR CARRYING OUT THE INVENTION

While looking for a good idea for minimizing the color unevenness to be produced by an LED lamp, it occurred to the present inventors that the color unevenness should be reduced significantly if the light radiated obliquely upward (in yellowish white) was scattered and mixed with the other light rays producing color white. However, if a method of making a structure that causes such scattering were too complicated, then the mass productivity of LED lamps would decline and the manufacturing cost thereof would rise. For that reason, the color unevenness is preferably minimized by using as simple a structure as possible. In view of this consideration, the present inventors discovered that the color unevenness could be reduced effectively by covering the phosphor resin portion with a light-transmissive resin portion in which a diffusing agent is dispersed as fine particles (i.e., an optical diffusion layer), thus acquiring the basic idea of the present invention.

An LED lamp according to the present invention includes at least one LED chip that is mounted on a substrate, a phosphor resin portion that covers the LED chip, and a lens to act on the outgoing light of the phosphor resin portion. An optical diffusion layer is arranged between the phosphor resin portion and the lens. Particles are dispersed in the optical diffusion layer so as to scatter the outgoing light of the phosphor resin portion.

Hereinafter, preferred embodiments of the present invention will be described with reference to the accompanying drawings. If any pair of components illustrated in multiple drawings has substantially the same function, those components will be identified by the same reference numeral for the sake of simplicity. It should be noted that the present invention is in no way limited to the following specific preferred embodiments.

Hereinafter, a first specific preferred embodiment of an LED lamp according to the present invention will be described with reference to FIGS. 10 and 11.

FIG. 10 schematically illustrates a configuration for an LED lamp 100 according to this preferred embodiment. The LED lamp 100 includes an LED chip 12 that is mounted on a substrate 11, a phosphor resin portion 13 that covers the LED chip 12, and a light-transmissive resin portion 20 that coats the phosphor resin portion 13. The phosphor resin portion 13 includes a phosphor (or luminophor) for converting the emission of the LED chip 12 into light having a longer wavelength than the emission and a resin in which the phosphor is dispersed, and functions as an optical diffusion layer. A diffusing agent is dispersed in the light-transmissive resin portion 20. Examples of the diffusing agent include fine particles of $SiO_2$, MgO, $BaSO_4$ or $Al_2O_3$. The fine particles may have a mean particle size of several nanometers to about 50 μm.

In this preferred embodiment, the light-transmissive resin portion 20 is designed so as to have a similar profile to that of the phosphor resin portion 13 (i.e., such that the light-transmissive resin portion 20 has a uniform thickness). In the example illustrated in FIG. 10, the respective profiles of the light-transmissive resin portion 20 and the phosphor resin portion 13 correspond to that of a cylinder. Also, the LED chip 12 is a bare chip LED that has been flip-chip bonded onto the substrate 11.

The LED lamp shown in FIG. 11 includes not only all of the components shown in FIG. 10 but also a reflector 40 and a lens 22 as well. More specifically, a reflector 40, which has an opening 44 to store the phosphor resin portion 13 with the light-transmissive resin portion 20, is put on the substrate 11. In this structure, a side surface defining the opening 44 of the reflector 40 functions as a reflective surface 42 that reflects the emission of the LED chip 12. It should be noted that the reflective surface 42 is spaced apart from the side surface of the light-transmissive resin portion 20. Also, a lens 22 with a condensing function is arranged so as to mold the light-transmissive resin portion 20. That is to say, the lens 22 is arranged so as to fill the opening 44 and cover the light-transmissive resin portion 20.

In the LED lamp 100 of this preferred embodiment, the light-transmissive resin portion 20 is arranged so as to cover the phosphor resin portion 13 and a diffusing agent is dispersed in the light-transmissive resin portion 20. Thus, the color unevenness that would otherwise be produced by the light radiated obliquely upward as viewed from the LED chip 12 can be minimized. That is to say, the diffusing agent included in a part of the light-transmissive resin portion 20 that is located above the LED chip 12 diffuses the light that has been emitted from the phosphor inside of that part and mixes it with the other light rays, thereby changing the curve A into the curve B in portion (b) of FIG. 9. As a result, the color unevenness can be reduced significantly.

If a diffusing agent were dispersed in the lens 22, not the light-transmissive resin portion 20, then the color unevenness could be eliminated without the light-transmissive resin portion 20. This idea is certainly an effective measure for eliminating the color unevenness but that will interfere with the condensing function of the lens 22, too. That is to say, if a diffusing agent were dispersed in the lens 22, then the lens would diffuse the incoming light instead of condensing it, and therefore, would not work properly. That is why the best choice would be to disperse a diffusing agent in the light-transmissive resin portion 20 and arrange the lens 22 to cover the light-transmissive resin portion 20.

The LED lamp of this preferred embodiment may have the following specifications. The LED chip 12 of this preferred embodiment is an LED element that produces light having a peak wavelength falling within the visible range of 380 nm to 780 nm. The phosphor dispersed in the phosphor resin portion 13 produces an emission that has a different peak wavelength from that of the LED chip 12 within the visible range of 380 nm to 780 nm. In this preferred embodiment, the LED chip 12 is a blue LED chip that emits a blue light ray and the phosphor included in the phosphor resin portion 13 is a yellow phosphor that transforms the blue ray into a yellow ray. The blue and yellow rays are mixed together to produce white light. Also, the LED chip 12 of this preferred embodiment is preferably an LED chip made of a gallium nitride (GaN) based material and emits light with a wavelength of 460 nm, for example. For example, if a blue-ray-emitting LED chip is used as the LED chip 12, $(Y.Sm)_3$, $(Al.Ga)_5O_{12}$:Ce or $(Y_{0.39}Gd_{0.57}Ce_{0.03}Sm_{0.01})_3Al_5O_{12}$ may be used effectively as the phosphor. In this preferred embodiment, the resin in which the phosphor is dispersed is a silicone resin, and the phosphor has a mean particle size of 3 μm to 15 μm and has a greater specific gravity than the silicone resin.

The light-transmissive resin portion 20 may be made of a silicone resin, for example. A silicon resin is preferred because the silicon resin has higher thermal resistance than epoxy resin and other resins and can resist well the heat that has been dissipated from the LED chip 12. Besides, by interposing the light-transmissive resin portion 20 of the silicone resin, even if the lens 22 altered (e.g., colored) due to intense heat, the light-transmissive resin portion 20 could relax the thermal alteration of the lens 22. The light-transmissive resin portion 20 may have a thickness of 10 μm to 1 mm, for example. In the examples illustrated in FIGS. 10 and 11, if the LED chip 12 has approximately 0.3 mm×0.3 mm dimensions, the phosphor resin portion 13 may have a diameter of about 0.7 mm to about 0.9 mm (e.g., 0.8 mm) and the light-transmissive resin portion 20 may have a thickness of 20 μm to 50 μm, for example. To reduce the color unevenness sufficiently effectively, the diffusing agent may be dispersed around the corners of the light-transmissive resin portion 20 (i.e., parts that are located above the LED chip 12). To simplify the manufacturing process, however, it would be convenient to disperse the diffusing agent in the entire light-transmissive resin portion 20.

In this preferred embodiment, the lens 22 plays both the role of condensing the emission of the LED chip 12 and the role of molding the phosphor resin portion 13 that is coated with the light-transmissive resin portion 20. The lens 22 may be made of a resin, glass or any other suitable material. In this preferred embodiment, the lens 22 is made of an epoxy resin and may have a diameter of 2 mm to 7 mm and a height of 1 mm to 15 mm, for example.

The reflector 40 that has the reflective surface 42 surrounding the lens 22 and the LED chip 12 may be made of a metal such as aluminum, copper, stainless steel, iron, or an alloy thereof, for example. The opening 44 of the reflector 40 is filled with the material of the lens 22, thereby molding the phosphor resin portion 13 coated with the light-transmissive resin portion 20 and forming a substantially hemispheric portion over the phosphor resin portion 13 and above the reflector 40. In the example illustrated in FIG. 11, the material of the lens 22 (or a molding material) also reaches the upper surface of the reflector 40.

In this preferred embodiment, the substrate 11 may be a multilayer substrate as shown in FIG. 12. The multilayer substrate 30 (11) shown in FIG. 12 includes a base substrate 32 and an interconnect layer 34 on the base substrate 32. The base substrate 32 may be a metallic substrate, for example. The interconnect layer 34 includes an interconnect pattern 36 that has been formed on a composite layer including an inorganic filler and a resin. It is preferable to use a metallic substrate and a composite layer as the base substrate 32 and the interconnect layer 34, respectively, to dissipate the heat from the LED chip 12 more efficiently. In this example, the interconnect layer 34 has a multilevel interconnect structure and the LED chip 12 is flip-chip bonded to the uppermost interconnect pattern 36.

An underfill (stress relaxing layer) may be provided between the reflector 40 and the interconnect layer 34. The underfill can not only relax the stress, resulting from the difference in thermal expansion coefficient between the metallic reflector 40 and the interconnect layer 34, but also ensure electrical insulation between the reflector 40 and the uppermost interconnect pattern 36.

In this exemplary arrangement, the side surface of the phosphor resin portion 13 coated with the light-transmissive resin portion 20 is spaced apart from the reflective surface 42 of the reflector 40. By adopting such a spaced arrangement, the shape of the phosphor resin portion 13 can be freely designed without being restricted by the shape of the reflective surface 42 of the reflector 40. As a result, the color unevenness that would be produced due to a variation in the thickness of the resin portion can be reduced significantly. Such a spaced arrangement and its effects are described in Patent Document No. 5, the entire contents of which are hereby incorporated by reference.

In the preferred embodiment described above, the phosphor resin portion 13 has a substantially cylindrical shape.

However, the cross-sectional shape of the "substantially cylindrical" phosphor resin portion does not have to be "completely round" in a strict sense. If the cross-sectional shape is a polygon with six or more vertices, then the polygon is sufficiently axisymmetric and can be regarded as almost "circular". This is why the "cylindrical resin portion" may also have a polygonal cross-sectional shape with six or more vertices. By using the phosphor resin portion 13 with such a substantially cylindrical shape, even if the LED chip 12 is flip-chip bonded onto the substrate 11 (30) by ultrasonic flip-chip bonding, which is a preferred bonding technique, and has turned to a certain degree due to the ultrasonic vibrations, the resultant spatial distribution of the light emitted from the LED chip will not be affected so much as a situation where the phosphor resin portion 13 has a triangular or quadrangular prism shape.

An LED lamp 100 according to this preferred embodiment may include a plurality of LED chips 12. More specifically, an LED lamp 100 may include a two-dimensional (e.g., matrix) arrangement of LEDs, each having the structure shown in FIG. 11 or 12. An exemplary arrangement is shown in FIG. 13.

FIG. 13 illustrates a configuration for a card LED lamp 100 including a plurality of LED chips 12. On the surface of the card LED lamp 100, arranged are feeder terminals 38 that are electrically connected to the interconnect pattern 36 for supplying electric power to the LED chips 12. To use the card LED lamp 100, a connector (not shown), to/from which the LED lamp 100 is readily insertable and removable, and a lighting circuit (not shown, either) may be electrically connected together and the card LED lamp 100 may be inserted into the connector.

Figure 14:
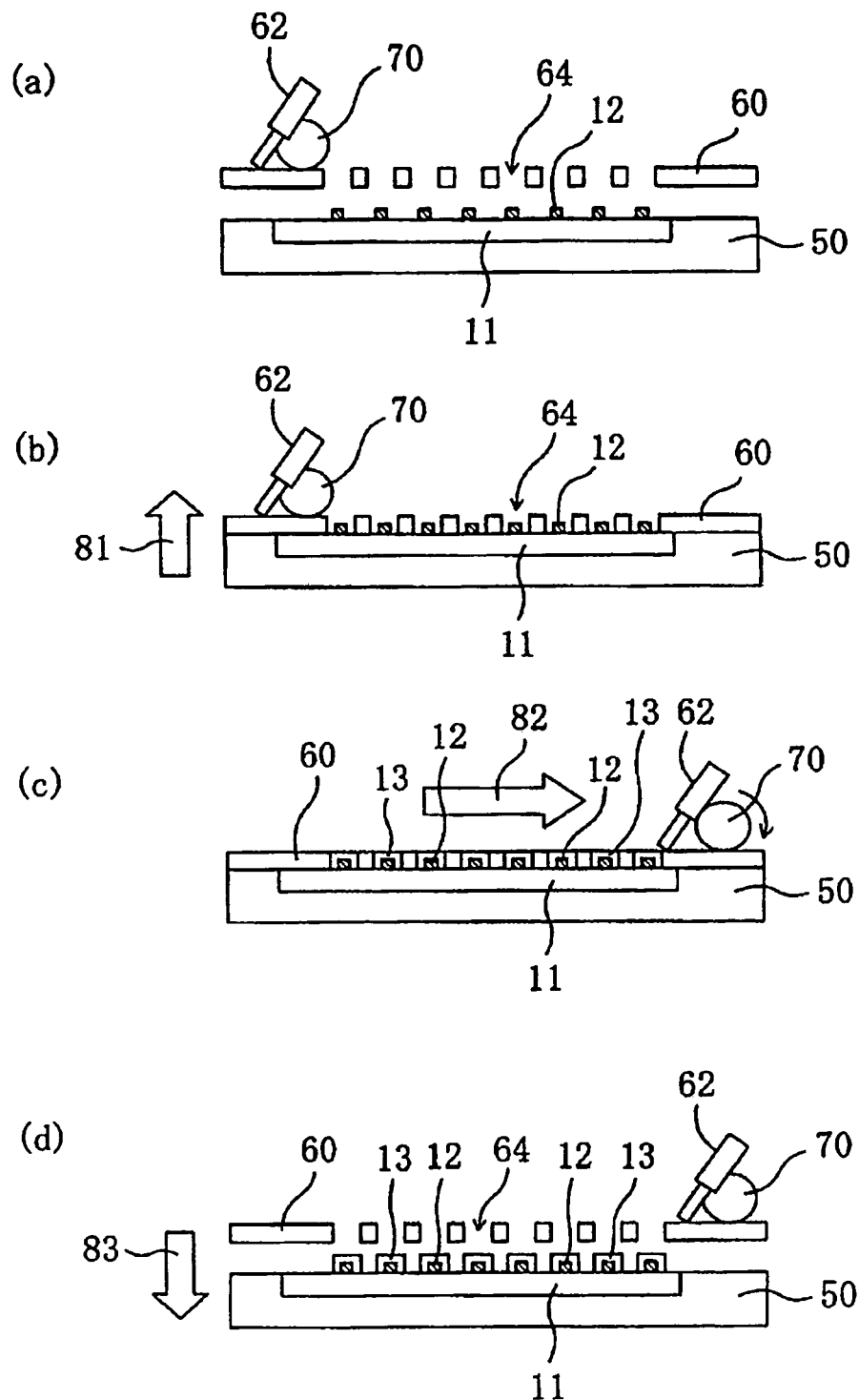
Figure 15:
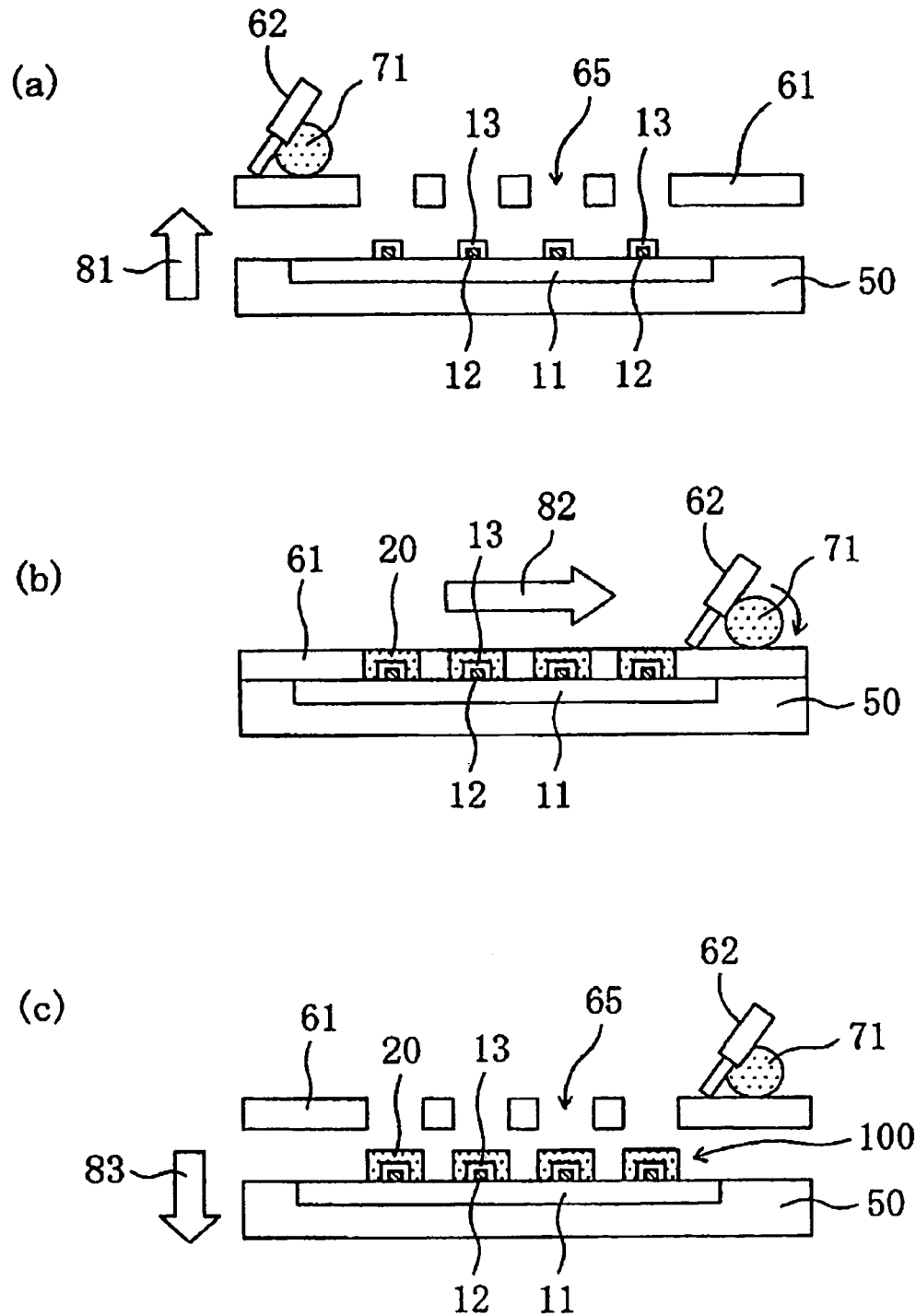

Hereinafter, a method for fabricating an LED lamp 100 according to this preferred embodiment will be described with reference to FIGS. 14 and 15.

In a manufacturing process according to this preferred embodiment, after a substrate 11 on which a plurality of LED chips 12 are arranged two-dimensionally has been prepared, multiple phosphor resin portions 13 are formed simultaneously by the same method on the substrate 11 so as to cover the LED chips 12, and then multiple light-transmissive resin portions 20 are formed simultaneously by the same method on the substrate 11 so as to coat the phosphor resin portions 13. In this preferred embodiment, both the phosphor resin portions 13 and the light-transmissive resin portions 20 are formed by a printing method.

First, as shown in FIG. 14(a), a substrate 11 on which a number of LED chips 12 are arranged is mounted on a stage 50. A metallic mask (i.e., a printing stencil) 60, having a plurality of openings 64 that will define the shape of phosphor resin portions 13 for the respective LED chips 12, is positioned over the substrate 11. A phosphor paste 70 has been put on some area on the upper surface of the metallic mask 60 and will be printed by a squeeze 62.

When all of these members are in their respective positions shown in FIG. 14(a), the stage 50 is brought upward as pointed by the arrow 81 so as to contact with the metallic mask 60 as shown in FIG. 14(b). Next, as shown in FIG. 14(c), the squeeze 62 is moved in the direction pointed by the arrow 82, thereby getting printing done. That is to say, by filling the openings 64 of the metallic mask 60 with the phosphor paste 70, phosphor resin portions 13 are formed so as to cover the LED chips 12.

Thereafter, when the stage 50 is separated from the metallic mask 60 as pointed by the arrow 83 in FIG. 14(d), a structure including an array of the phosphor resin portions 13 on the substrate 11 is obtained.

Subsequently, the printing process is carried on in a similar manner with the metallic mask 60 replaced with a metallic mask 61 that defines the positions and shape of the light-transmissive resin portions 20.

Specifically, a metallic mask (i.e., a printing stencil) 61, having a plurality of openings 65 that will define the positions and shape of the light-transmissive resin portions 20, is positioned over the substrate 11 on which the phosphor resin portions 13 are arranged so as to cover the LED chips 12. A resin paste 71 in which a diffusing agent is dispersed has been put on some area on the upper surface of the metallic mask 61 and will be printed by the squeeze 62. It should be noted that although eight LED chips 12 are illustrated in FIGS. 14(a) through 14(d), only four of those LED chips 12 are illustrated in FIGS. 15(a) through 15(c).

When all of these members are in their respective positions shown in FIG. 15(a), the stage 50 is brought upward as pointed by the arrow 81 so as to contact with the metallic mask 61 as shown in FIG. 15(b). Next, the squeeze 62 is moved in the direction pointed by the arrow 82, thereby getting printing done. That is to say, by filling the openings 65 of the metallic mask 61 with the resin paste 71, light-transmissive resin portions 20 are formed so as to coat the phosphor resin portions 13.

Thereafter, when the stage 50 is separated from the metallic mask 61 as pointed by the arrow 83 in FIG. 15(c), an LED lamp 100 according to this preferred embodiment is completed. If a reflector 40 having openings 44 is arranged on the substrate 11 after that and lenses 22 are formed so as to close the openings 44, then the structure shown in FIG. 11 can be obtained.

In a method for fabricating an LED lamp according to this preferred embodiment, multiple phosphor resin portions 13 are formed simultaneously by the same method on the substrate 11 so as to cover the LED chips 12, and then multiple light-transmissive resin portions 20 are formed simultaneously by the same method so as to coat the phosphor resin portions 13. And a diffusing agent that scatters the outgoing light of the phosphor resin portions is dispersed in the light-transmissive resin portions 20. Consequently, an LED lamp that produces substantially no color unevenness can be fabricated easily.

Figure 1:
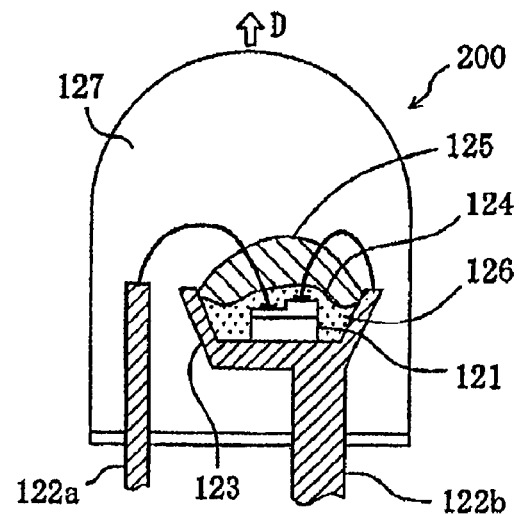
FIG. 1 is a cross-sectional view schematically illustrating a configuration for an LED lamp with a bullet shaped appearance as disclosed in Patent Document No. 2.
Figure 2:
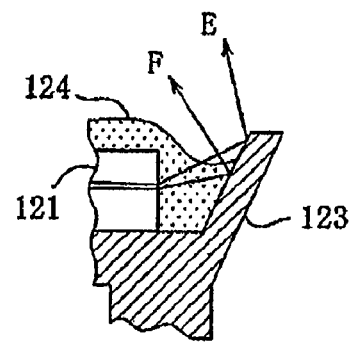
FIG. 2 is an enlarged cross-sectional view illustrating a main portion of the bullet-shaped LED lamp shown in FIG. 1.
Figure 3:
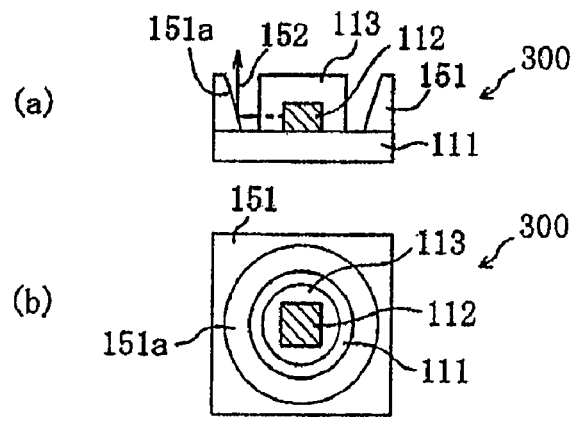
FIGS. 3(a) and 3(b) are respectively a side cross-sectional view and a top view illustrating an LED lamp as disclosed in Patent Document No. 5.
Figure 4:
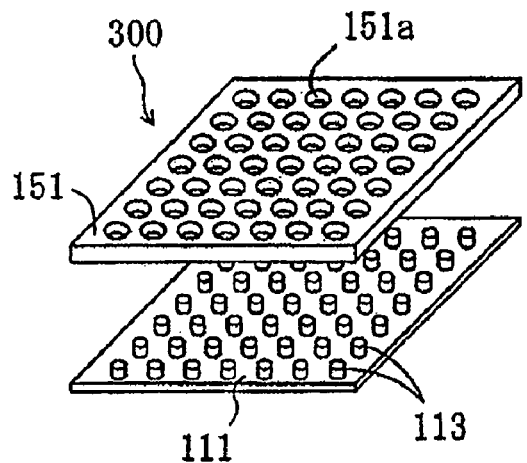
FIG. 4 is a perspective view illustrating an exemplary configuration in which multiple LED lamps having the structure shown in FIG. 3 are arranged in matrix.
Figure 5:
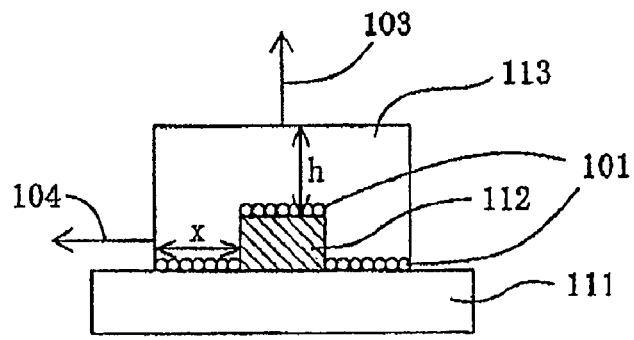
FIG. 5 is a side cross-sectional view illustrating an exemplary LED lamp as disclosed in Patent Document No. 5.
Figure 6:
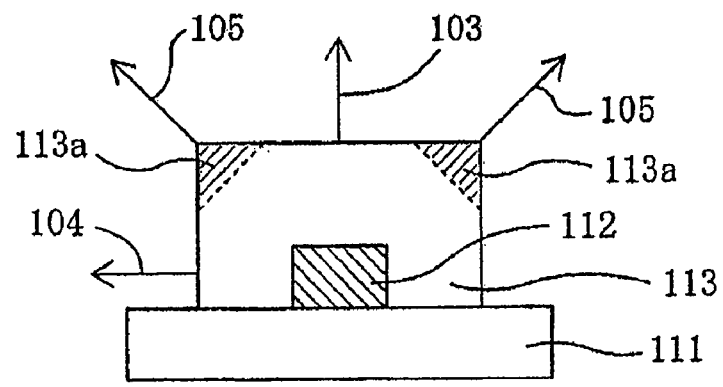
FIG. 6 is a side cross-sectional view of an LED lamp illustrating why color unevenness is produced.
Figure 7:
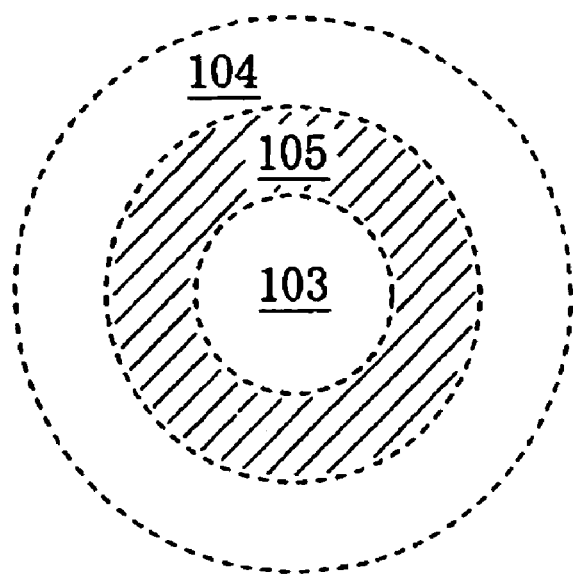
FIG. 7 is a top view illustrating a state where color unevenness has been produced.
Figure 8:
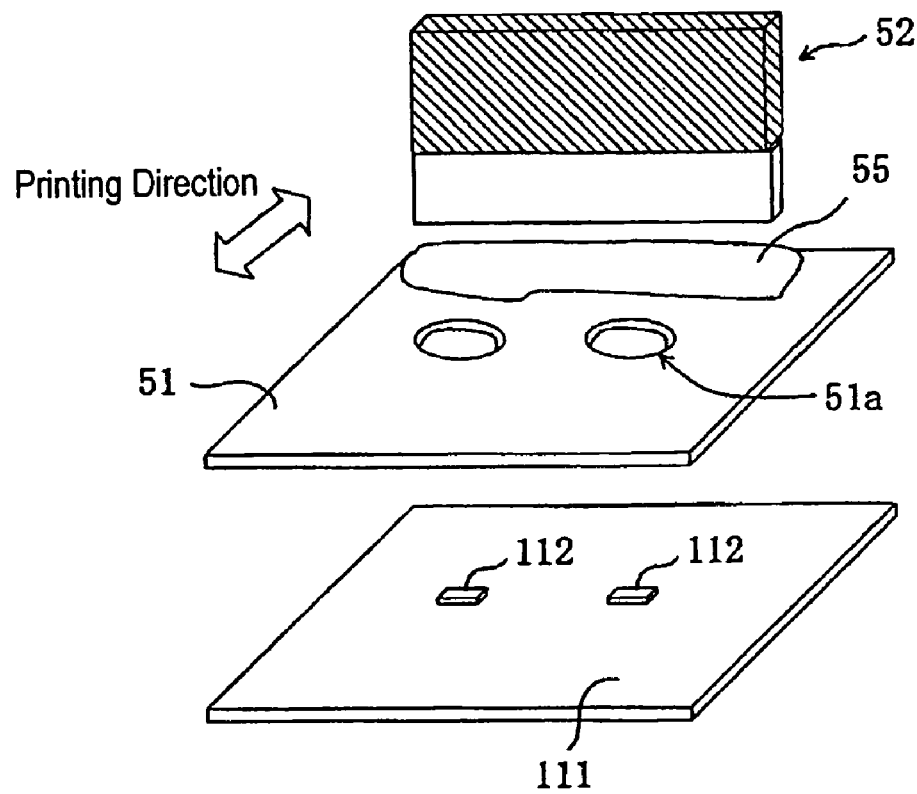
FIG. 8 is a perspective view illustrating a printing technique for fabricating an LED lamp.

According to the method of this preferred embodiment, the light-transmissive resin portions 20 are formed after the phosphor resin portions 13 have been formed. Thus, there is no need to change the method of making the phosphor resin portions 13 itself, and therefore, the LED lamp can be fabricated while keeping the size and shape precisions of the phosphor resin portion 13 sufficiently high. Specifically, if one attempted to minimize the color unevenness by rounding the corners 113a as shown in FIG. 6, then the openings (holes) 64 of the metallic mask 60 for use in the process steps shown in FIGS. 14(a) through 14(d) would have decreased precision, i.e., non-uniform shapes, thus producing asymmetric color unevenness unintentionally. On the other hand, according to the method of this preferred embodiment, the shape of the openings 64 of the metallic mask 60 does not have to be changed. As a result, the non-uniformity in the shape of the openings 64 can be minimized and the asymmetric color unevenness can be substantially eliminated.

In addition, both the process step of forming the phosphor resin portions 13 and the process step of forming the light-transmissive resin portions 20 are carried out by a printing process. Thus, those portions can be formed at a time even if a huge number of LED chips 12 are arranged two-dimensionally. Besides, the process step of forming the phosphor resin portions 13 and the process step of forming the light-transmissive resin portions 20 can be carried out continuously just by changing the metallic masks 60 and 61. As a result, high-precision positioning can be done relatively easily and the throughput increases, too. On top of that, the light-transmissive resin portions 20 that have a similar profile to that of the phosphor resin portions 13 can be formed more easily. Consequently, even thin light-transmissive resin portions 20 with as small a thickness as 50 µm or less can be obtained just as intended.

In the preferred embodiment described above, the light-transmissive resin portions 20 and the phosphor resin portions 13 are formed in substantially the same shape. Alternatively, the light-transmissive resin portions 20 may be formed so as to have a greater thickness on the peripheral area 21b of the upper surface of the phosphor resin portion 13 than at the central area 21a of the upper surface of the phosphor resin portion 13. If the reflector 40 and the lens 22 are added to the arrangement shown in FIG. 16, the arrangement shown in FIG. 17 is obtained.

If the thickness of the light-transmissive resin portion 20 is increased on the upper surface peripheral area 21b as shown in FIGS. 16 and 17, then a larger amount of diffusing agent is included in the corner portions and can diffuse a greater quantity of light accordingly. That is why even significant color unevenness can be eliminated effectively by adopting such an arrangement. It should be noted that even though the shape of the light-transmissive resin portion 20 is changed, the shape of the phosphor resin portion 13 itself does not have to be changed, and therefore, the LED lamp can still be fabricated with the size and shape precisions of the phosphor resin portion 13 kept sufficiently high.

Hereinafter, a method of making such light-transmissive resin portions 20 that are thicker in the upper surface peripheral area 21b than in the upper surface central area 21a will be described with reference to FIGS. 18(a) through 18(c).

After the process step shown in FIG. 15(c) has been performed, first, a mask (such as a silk screen mask) 66 is positioned over the substrate 11 as shown in FIG. 18(a). The mask 66 has openings 67 defining the pattern of the upper surface peripheral areas 21b of the light-transmissive resin portions 20.

Next, the stage 50 is elevated as pointed by the arrow 81, thereby bringing the light-transmissive resin portions 20 into contact with the mask 66. Thereafter, the squeeze 62 is moved in the direction pointed by the arrow 82, thereby getting printing done as shown in FIG. 18(b). Subsequently, when the stage 50 is separated from the mask 66 as pointed by the arrow 83 in FIG. 18(c), light-transmissive resin portions 20 that are thickened in the upper surface peripheral area 21b are completed.

The light-transmissive resin portions 20 do not have to be formed by such a method that needs to get printing done twice. Alternatively, by appropriately changing masks to make the light-transmissive resin portions 20, the light-transmissive resin portions 20 can be formed in any of various other shapes. For example, FIGS. 19(a) through 19(c) are cross-sectional views illustrating respective process steps for making substantially hemispherical light-transmissive resin portions 20.

First, as shown in FIG. 19(a), a mask 68 having openings 69 that define the substantially hemispherical shape of the light-transmissive resin portions 20 is aligned with the stage 50 as pointed by the arrow 81. Then, a printing process gets done as pointed by the arrow 82 in FIG. 19(b). Thereafter, when the stage 50 is separated from the mask 68 as pointed by the arrow 83, substantially hemispherical light-transmissive resin portions 20 can be obtained as shown in FIG. 19(c).

According to this method, there is no need to change the shape of the phosphor resin portions 13 themselves, either. That is why even if the shape of the light-transmissive resin portions 20 is changed freely to eliminate the color unevenness that would be caused by the corner portions, the shape precision of the phosphor resin portions 13 never diminishes.

In the preferred embodiment described above, a stencil printing process is supposed to be adopted from various printing techniques as the same method for making multiple members simultaneously (i.e., so-called "batch processing"). Alternatively, an intaglio printing technique or a transfer method (i.e., a planographic printing process) may also be used. In the intaglio printing process, a printing plate with grooves (not holes or openings that have been cut through the plate) is used. On the other hand, according to the transfer method (planographic printing process), a photosensitive resin film is deposited on a printing plate and engraved into a predetermined pattern using a resist, and the pattern is used for printing. As another alternative, a dispenser method may also be adopted as shown in FIG. 20. That is to say, the light-transmissive resin portions 20 may also be formed by using a mask 68' and a dispenser 90. Furthermore, the light-transmissive resin portions 20 may even be formed by using a mold as shown in FIGS. 21(a) through 21(d).

Figure 21:
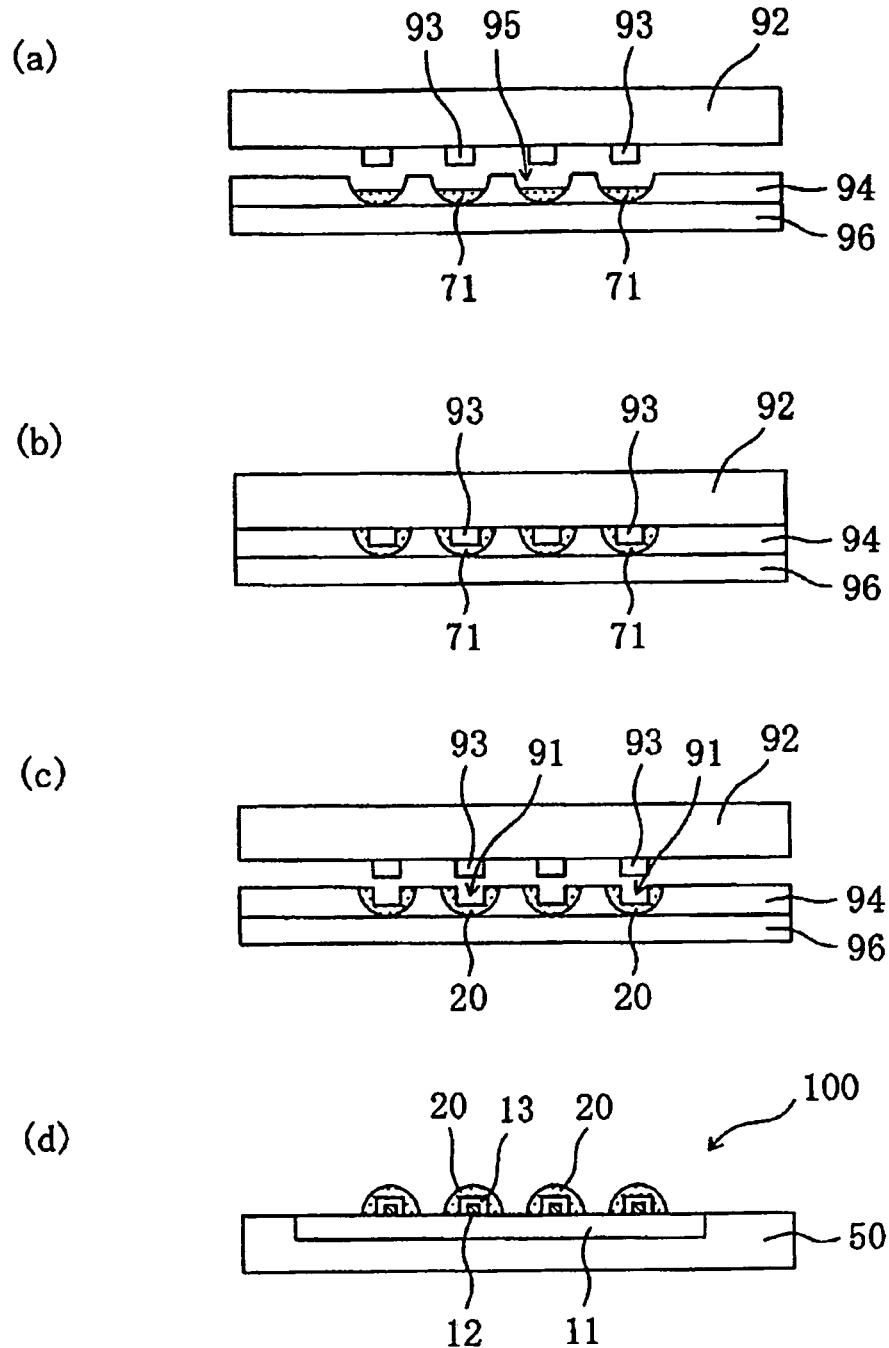

Specifically, first, a resin paste 71 in which a diffusing agent is dispersed is poured into the mold shown in FIG. 21(a), which consists of a lower half 94, defining the shape of the light-transmissive resin portions 20 and fixed on a substrate 96, and an upper half 92 including protrusions 93 to define the shape of the phosphor resin portions 13. And the resin paste 71 has been poured into the lower half 94.

Next, as shown in FIG. 21(b), the upper and lower halves 92 and 94 are aligned with each other and joined together. Thereafter, when the upper and lower halves 92 and 94 are released from each other as shown in FIG. 21(c), stamping is finished and light-transmissive resin portions 20 are formed in a predetermined shape. Finally, the light-transmissive resin portions 20 are combined with their associated phosphor resin portions 13 as shown in FIG. 21(d). In this manner, the LED lamp 100 of this preferred embodiment is completed.

As described above, by using the LED lamp 100 of this preferred embodiment, a lamp that causes significantly reduced color unevenness can be obtained. Specifically, this LED lamp 100 may be used in various applications such as those illustrated in FIGS. 22, 23 and 24. In each of these examples, the LED lamp 100 is a card LED lamp. FIG. 22 illustrates an exemplary configuration for a desk lamp. FIG. 23 illustrates an exemplary configuration that can be used as a replacement for a straight-tube fluorescent lamp. And FIG. 24 illustrates an exemplary configuration that can be used as a replacement for a circular-tube fluorescent lamp.

In the configuration shown in FIG. 22, the card LED lamp 100 is set by being inserted into a receptacle portion 164, which is provided for its body portion 160, so as to get ready to turn ON. On the other hand, in the configurations shown in FIGS. 23 and 24, the card LED lamp 100 is set through a slot 165, which has been cut through their body portion 160, and gets ready to turn ON. The body portion 160 is connected to an AC power supply and includes a lighting circuit. Since the card LED lamp 100 causes no color unevenness, light with no color unevenness can also be produced in the applications shown in FIGS. 22, 23 and 24.

Also, in the preferred embodiment described above, the white LED lamp 100, including a blue LED chip 12 and a yellow phosphor in combination, has been described. However, a white LED lamp, which produces white light by combining a near-ultraviolet LED chip, emitting a near-ultraviolet ray (having a wavelength of 405 nm, for example), with a phosphor that produces red (R), green (G) and blue (B) rays when excited with the near-ultraviolet ray, was also developed recently. No matter whether such a near-ultraviolet LED chip is used or not, as long as white light is supposed to be produced by combining an LED chip with a phosphor, the color unevenness phenomenon will almost always occur due to the difference in distance the light travels through the phosphor as shown in FIG. 6. That is why the technique of this preferred embodiment should be effective in any of those applications. The near-ultraviolet LED chip emits a near-ultraviolet ray with a wavelength of 380 nm to 410 nm. The phosphor producing red (R), green (G) and blue (B) rays has peak wavelengths of 450 nm, 540 nm and 610 nm within the visible range of 380 nm to 780 nm. It should be noted that some LED chips emitting an ultraviolet ray (which are sometimes called "ultraviolet LED chips") radiate an ultraviolet ray with a wavelength of 360 nm. And if an LED lamp uses such ultraviolet LED chips, that ultraviolet ray is invisible to human eyes, thus causing no color unevenness problem. Even so, the luminance may still vary due to the difference in distance that the ultraviolet ray travels through the phosphor. The technique of this preferred embodiment can also be used effectively to resolve such a luminance variation problem.

Figure 25:
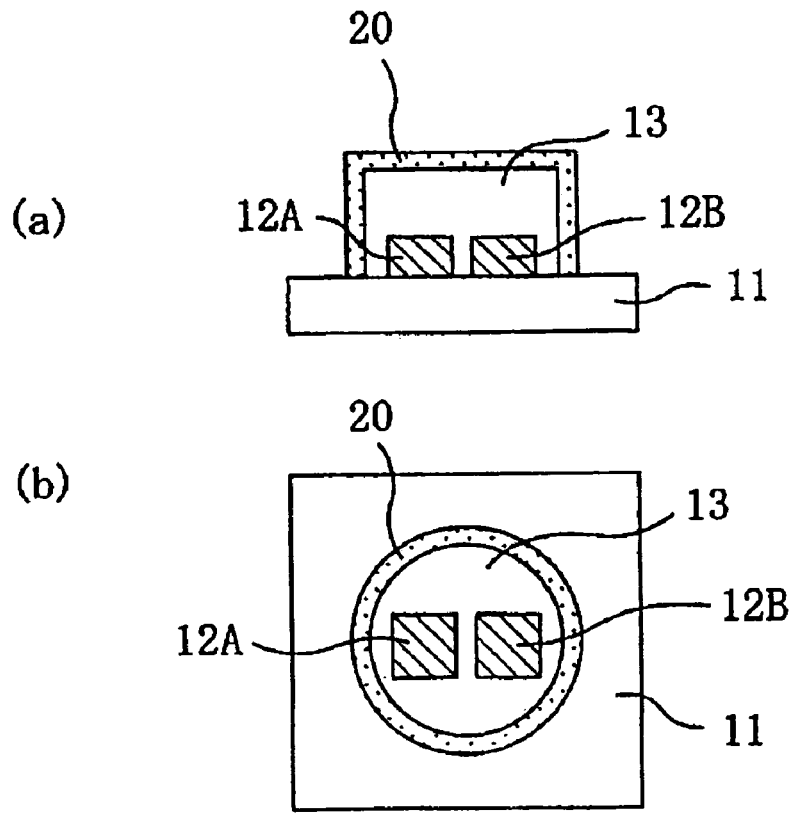

In the preferred embodiments described above, one LED chip 12 is arranged within one phosphor resin portion 13. However, the present invention is in no way limited to those specific preferred embodiments. If necessary, two or more LED chips 12 may be arranged within a single phosphor resin portion 13. FIGS. 25(*a*) and 25(*b*) illustrate such an alternative arrangement in which two LED chips 12A and 12B are arranged within one phosphor resin portion 13 and in which the phosphor resin portion 13 is covered with a light-transmissive resin portion 20.

In this case, the LED chips 12A and 12B may emit either light rays falling within the same wavelength range or light rays falling within mutually different wavelength ranges. For example, the LED chip 12A may be a blue LED chip and the LED chip 12B may be a red LED chip. If multiple LED chips are arranged within the single phosphor resin portion 13, light rays passing through the phosphor often have to travel different distances. Thus, the arrangement of this preferred embodiment is particularly advantageous in that case, too. When the blue LED chip 12A and red LED chip 12B are both used, a white LED lamp, of which the color rendering performance is excellent in red colors, can be obtained. More specifically, if a blue LED chip and a yellow phosphor are combined, white can be produced but that white is somewhat short of red components. Consequently, the resultant white LED lamp exhibits insufficient color rendering performance in red colors. However, if the red LED chip 12B is combined with the blue LED chip 12A, then the color rendering performance of the white LED lamp in red colors can be improved. As a result, an LED lamp that can be used even more effectively as general illumination is realized.

In the preferred embodiments described above, the light-transmissive resin portion 20 functioning as an optical diffusion layer covers the phosphor resin portion 13 entirely. However, the present invention is in no way limited to those specific preferred embodiments. Alternatively, the light-transmissive resin portion 20 functioning as an optical diffusion layer may have various other forms as shown in FIGS. 26(*a*) through 26(*c*).

Figure 26:
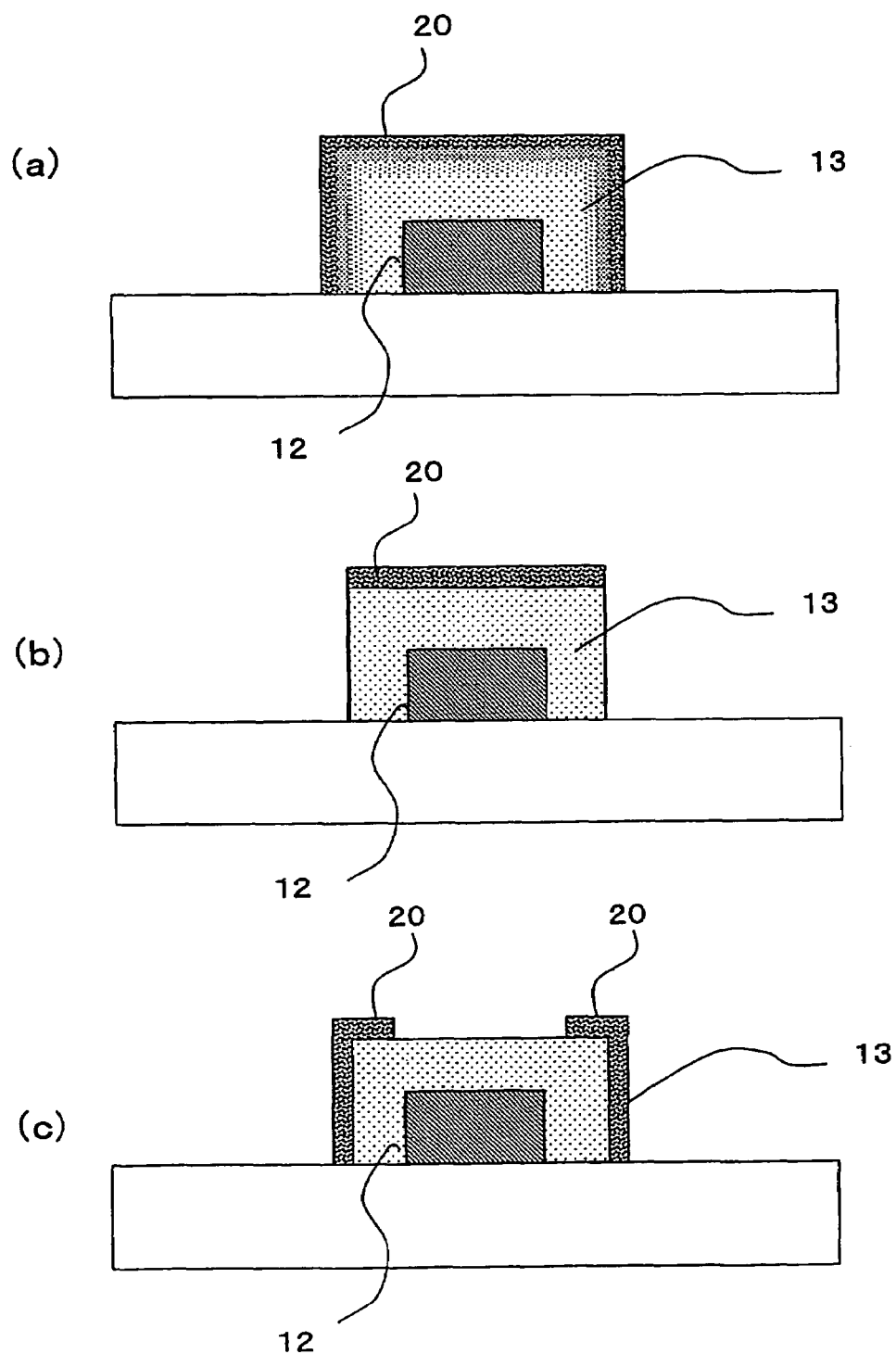

Specifically, in the example illustrated in FIG. 26(*a*), a surface region of the phosphor resin portion 13 functions as the light-transmissive resin portion (optical diffusion layer) 20. To maintain the resin in a desired shape, not just a phosphor but also fine particles are preferably dispersed in the phosphor resin portion 13. Such fine particles have the function of diffusing light. By setting the number density of the fine particles (non-phosphor) higher in the surface region of the phosphor resin portion 13 than in the other regions, the light diffusion ability can be increased in that region. For example, if the number density of the fine particles (non-phosphor) in the surface region of the phosphor resin portion 13 is set at least 1.2 times as high as that of the fine particles (non-phosphor) in an inner region of the phosphor resin portion 13, then the surface region of the phosphor resin portion 13 can function as an "optical diffusion layer". The surface region with the intentionally increased density of fine particles may have a thickness of 100 nm to 2 mm, for example. When the surface region of the phosphor resin portion 13 is made to function as an optical diffusion layer in this manner, the phosphor may or may not be present in that region.

To make the structure shown in FIG. 26(*a*), after the phosphor resin portion 13 has been formed, fine particles may be externally introduced into a surface region thereof. The fine particles may be introduced by any arbitrary method. For example, the fine particles may be sprayed against the phosphor resin portion 13 yet to be cured. Alternatively, the fine particles may be deposited on the bottom of a lens that has been separately prepared, and then the lens may be bonded onto the phosphor resin portion 13.

In this case, the optical diffusion layer has the form of a layer in which the fine particles are dispersed (with a thickness of 100 nm or more). That is why compared to a phosphor resin portion 13 of which the surface has just been roughened and made uneven, the optical diffusion layer can scatter light more efficiently.

In the example illustrated in FIG. 26(*b*), the light-transmissive resin portion 20 functioning as an optical diffusion layer covers only the upper surface of the phosphor resin portion 13. On the other hand, in the example illustrated in FIG. 26(*c*), the light-transmissive resin portion 20 functioning as an optical diffusion layer covers the phosphor resin portion 13 entirely except the central area of the upper surface of the phosphor resin portion 13. Even in the optical diffusion layer having the structure shown in FIG. 26(*b*) or 26(*c*), the light can be diffused efficiently enough at the periphery of the upper surface of the phosphor resin portion 13 to reduce the color unevenness sufficiently.

As can be seen, the point of the present invention is that an optical diffusion layer should be arranged between the phosphor resin portion and the lens and should be present at least between the peripheral area of the upper surface of the phosphor resin portion and the lens.

The present invention has been described by way of illustrative preferred embodiments. However, the present invention is in no way limited to those specific preferred embodiments but may be modified in various other ways.

An LED lamp including a phosphor as disclosed in Japanese Patent Application Laid-Open Publication No. 10-173240 is a relevant technology for the present invention. FIG. 27 illustrates an LED lamp disclosed in that document. In the LED lamp 400 shown in FIG. 27, not only a phosphor 404 but also a diffusing agent 406 are included in a resin case 405 that covers an LED chip 403 mounted on a leadframe 402. However, the LED lamp 400 shown in FIG. 27 is quite different from the arrangement of the present invention in that the diffusing agent is introduced into the phosphor resin portion itself, not into the light-transmissive resin portion that covers the phosphor resin portion. Furthermore, since the diffusing agent 406 is included in the resin case 405, the resin case 405 cannot be used as lens anymore.

INDUSTRIAL APPLICABILITY

The present invention provides an LED lamp that produces significantly reduced color unevenness, thus contributing to popularizing LED lamps as a general illumination source.

The invention claimed is:

1. A method for fabricating an LED lamp, the method comprising the steps of:
    (a) preparing a substrate with at least one LED chip mounted thereon;
    (b) forming a phosphor resin portion on the substrate such that at least the upper surface of the LED chip is covered with the phosphor resin portion; and
    (c) arranging a lens that acts on the outgoing light of the phosphor resin portion,
    wherein the method further comprises the steps of:
    (d) forming an optical diffusion layer, in which particles to scatter the outgoing light of the phosphor resin portion are dispersed, between the phosphor resin portion and the lens; and
    (e) increasing the thickness of the optical diffusion layer on the upper surface of the phosphor resin portion from around the center of the upper surface toward the periphery of the upper surface;
    wherein the phosphor resin portion has a cylindrical shape.

2. The method of claim 1, wherein the optical diffusion layer is made of a light-transmissive resin in which the particles are dispersed.

3. The method of claim 1, wherein the step (d) includes forming the optical diffusion layer that has a substantially uniform thickness over a surface of the phosphor resin portion.

4. The method of claim 1, wherein the optical diffusion layer has a thickness of 10 μm to 1 mm.

5. The method of claim 2, wherein the particles are made of at least one material selected from the group consisting of $SiO_2$, MgO, $BaSO_4$ and $Al_2O_3$.

6. The method of claim 1, wherein the LED chip is a bare chip LED, which has been flip-chip bonded onto the substrate.

7. The method of claim 1, wherein the steps (b) and (d) are performed by a printing technique.

8. An LED lamp comprising:
    at least one LED chip that is mounted on a substrate;
    a phosphor resin portion that covers at least the upper surface of the LED chip;
    a lens to act on the outgoing light of the phosphor resin portion; and
    an optical diffusion layer, which is arranged between the phosphor resin portion and the lens and in which particles to scatter the light are dispersed,
    wherein the thickness of the optical diffusion layer on the upper surface of the phosphor resin portion is greater around the periphery of the upper surface than around the center of the upper surface;
    wherein the phosphor resin portion has a cylindrical shape.

9. The LED lamp of claim 8, wherein the phosphor resin portion includes a phosphor for converting the emission of the LED chip into light that has a longer wavelength than the emission, and
    wherein the optical diffusion layer is made of a light-transmissive resin in which the particles are dispersed.

10. The LED lamp of claim 8, wherein the optical diffusion layer covers at least the periphery of the upper surface of the phosphor resin portion.

11. The LED lamp of claim 8, further comprising a reflector, which has an opening to store the optical diffusion layer therein, on the substrate,
    wherein a side surface defining the opening functions as a reflective surface for reflecting the emission of the LED chip.

12. The LED lamp of claim 11, wherein the reflective surface is spaced apart from a side surface of the optical diffusion layer.

13. A method for fabricating an LED lamp, the method comprising the steps of:
    (a) preparing a substrate with at least one LED chip mounted thereon;
    (b) forming a phosphor resin portion on the substrate such that at least the upper surface of the LED chip is covered with the phosphor resin portion; and
    (c) arranging a lens that acts on the outgoing light of the phosphor resin portion;
    wherein the method further comprises the steps of:
    (d) forming an optical diffusion layer, in which particles to scatter the outgoing light of the phosphor resin portion are dispersed, between the phosphor resin portion and the lens; and
    (e) increasing the thickness of the optical diffusion layer on the upper surface of the phosphor resin portion from around the center of the upper surface toward the periphery of the upper surface;
    wherein the steps (b) and (d) are performed by a printing technique.

* * * * *